(12) United States Patent
Brak et al.

(10) Patent No.: US 9,146,551 B2
(45) Date of Patent: Sep. 29, 2015

(54) SCHEDULER FOR PROCESSING SYSTEM

(71) Applicant: ASM IP Holding B.V., Almere (NE)

(72) Inventors: Maarten Brak, Almere (NE); Tom A. van Kesteren, Almere (NE)

(73) Assignee: ASM IP HOLDING B.V. (NL)

( * ) Notice: Subject to any disclaimer, the term of this patent is extended or adjusted under 35 U.S.C. 154(b) by 491 days.

(21) Appl. No.: 13/689,101

(22) Filed: Nov. 29, 2012

(65) Prior Publication Data

US 2014/0148924 A1   May 29, 2014

(51) Int. Cl.
*G05B 19/02* (2006.01)

(52) U.S. Cl.
CPC .................................... *G05B 19/02* (2013.01)

(58) Field of Classification Search
CPC ....................................................... G05B 19/02
See application file for complete search history.

(56) References Cited

U.S. PATENT DOCUMENTS

| | | | | |
|---|---|---|---|---|
| 6,122,566 A * | 9/2000 | Nguyen et al. | ................. | 700/218 |
| 6,312,525 B1 * | 11/2001 | Bright et al. | .................. | 118/719 |
| 6,383,402 B1 * | 5/2002 | Smith et al. | ...................... | 216/60 |
| 6,490,494 B1 * | 12/2002 | Yasuda | .......................... | 700/101 |
| 6,519,498 B1 * | 2/2003 | Jevtic et al. | ................... | 700/101 |
| 6,663,332 B1 * | 12/2003 | Sluijk et al. | ................... | 414/160 |
| 6,999,836 B2 * | 2/2006 | Schwarm et al. | ............. | 700/121 |
| 7,313,452 B2 | 12/2007 | Kobayashi et al. | | |
| 7,522,968 B2 * | 4/2009 | Hongkham et al. | .......... | 700/100 |
| 7,767,145 B2 * | 8/2010 | Jones | ................. | 422/62 |
| 7,789,971 B2 * | 9/2010 | Kevwitch | ........................ | 134/26 |
| 7,945,348 B2 * | 5/2011 | Pannese et al. | ............... | 700/248 |
| 8,055,370 B1 * | 11/2011 | Achtnig et al. | ............... | 700/108 |
| 2003/0020928 A1 * | 1/2003 | Ritzdorf et al. | ................ | 356/630 |
| 2004/0267641 A1 * | 12/2004 | Chang et al. | .................... | 705/28 |
| 2007/0238201 A1 * | 10/2007 | Funk et al. | ...................... | 438/14 |
| 2010/0080671 A1 * | 4/2010 | Okuno | ........................ | 414/217.1 |
| 2011/0160900 A1 * | 6/2011 | Morita | .......................... | 700/228 |
| 2011/0218659 A1 * | 9/2011 | Nomura | .......................... | 700/96 |
| 2011/0306159 A1 | 12/2011 | Ridder et al. | | |

* cited by examiner

*Primary Examiner* — Ramesh Patel
(74) *Attorney, Agent, or Firm* — Knobbe, Martens, Olson & Bear LLP

(57) ABSTRACT

A semiconductor processing system that includes a controller is disclosed. The controller may be configured to schedule the operation of the system. The controller may be programmed to determine a current state of the system. The current state may be defined at least by a location of one or more substrates and a processing status of the one or more substrates. The controller may be further programmed to generate a search tree having one or more branches. Each branch may identify one or more subsequent actions or branch pathways capable of being performed by the system in the current state. Further, the controller may be programmed to score each branch pathway of the generated search tree. The controller may be programmed to select a branch pathway and provide instructions to perform the actions in that branch pathway based at least in part on the score of the branch pathway.

45 Claims, 11 Drawing Sheets

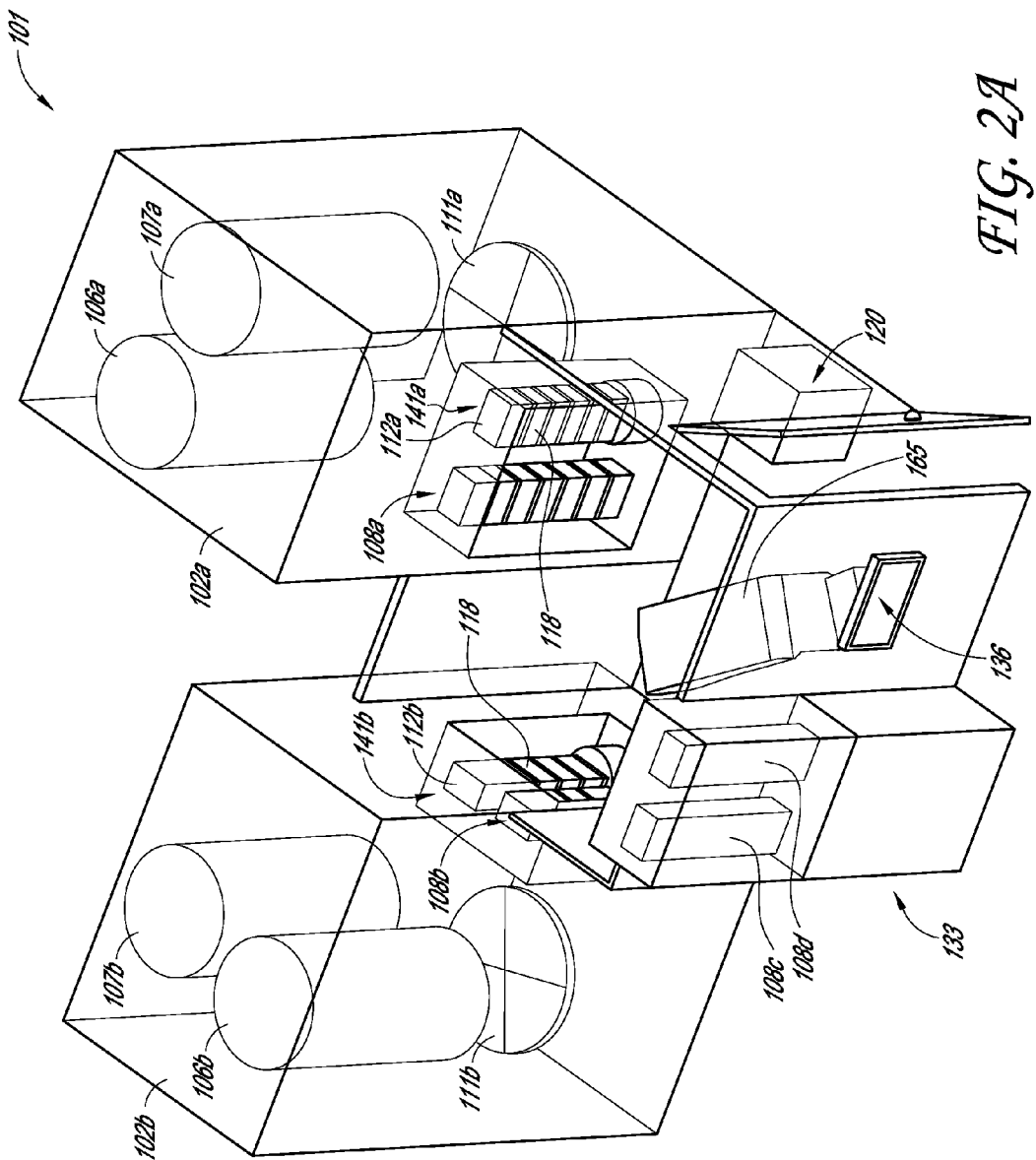

SCHEDULER FOR PROCESSING SYSTEM

BACKGROUND OF THE INVENTION

1. Field of the Invention

The field relates generally to systems and methods for semiconductor processing and, more particularly, to systems and methods for scheduling processes and actions for a semiconductor processing system.

2. Description of the Related Art

Semiconductor devices are commonly used in electronic devices, power generation systems, etc. These semiconductor devices may be manufactured using semiconductor substrates, which may be processed in batches in order to provide high throughput. For example, semiconductor substrates (e.g., wafers made of silicon or other semiconductor material in various embodiments) may be processed in large numbers so that tens, hundreds, or even thousands of substrates may simultaneously undergo a particular processing step. In various embodiments, each substrate may form many individual devices, such as, e.g., integrated circuits and/or solar cells or each substrate may form one device such as, e.g. a solar cell.

Processing substrates in large batches allows manufacturers to produce many devices in a short amount of time. In a processing system, each substrate may typically undergo numerous transport steps and one or more processing steps that may occur at different processing stations or reactors. Scheduling the transport and processing steps in the appropriate order may significantly affect the number of substrates processed in a particular amount of time, e.g., the throughput of the processing system. Accordingly, there is a continuing need for improved methods and systems for increasing the throughput of various types of processing systems.

SUMMARY

The systems, methods and devices of the present disclosure each have several innovative aspects, no single one of which is solely responsible for the desirable attributes disclosed herein.

In one embodiment, a semiconductor processing system is disclosed. The semiconductor processing system may include a controller configured to schedule the operation of the processing system. The controller may be programmed to determine a current state of the system. The current state may be defined at least by a location of one or more substrates and a processing status of the one or more substrates. The controller may be further programmed to generate a search tree having one or more branches. Each branch may identify an action that is capable of being performed by the system in the current state and, when performed, brings the system into a next or subsequent state. Each branch may be provided with one or more further branches, each further branch defining an action capable of being performed by the system in the next state, and so on. The branches together can form one or more branch pathways and can define one or more consecutive actions that are capable of being performed by the system in the current state. Further, the controller may be programmed to score each branch pathway of the generated search tree. The controller may be programmed to select a branch pathway based at least in part on the score of the branch pathway.

In another embodiment, a method for semiconductor processing is disclosed. The method may comprise determining a current state of a semiconductor processing system. The current state may be defined at least by a location of one or more substrates and a processing status of the one or more substrates. The method may further comprise generating a search tree having one or more branches. Each branch may identify an action that is capable of being performed by the system in the current state and, when performed, brings the system into a next or subsequent state. Each branch may be provided with one or more further branches, each further branch defining an action capable of being performed by the system in the next state, and so on. The branches together can form one or more branch pathways and can define one or more consecutive actions that are capable of being performed by the system in the current state. Further, the method may include scoring each branch pathway of the generated search tree. The method may also include selecting a branch pathway of identified action(s) to be performed based at least in part on the score of the branch pathway.

Details of one or more implementations of the subject matter described in this specification are set forth in the accompanying drawings and the description below. Other features, aspects, and advantages will become apparent from the description, the drawings, and the claims.

BRIEF DESCRIPTION OF THE DRAWINGS

Specific embodiments of the invention will now be described with reference to the following drawings, which are provided by way of example, and not limitation. Note that the relative dimensions of the following figures may not be drawn to scale.

FIG. 2A is a schematic perspective view of a semiconductor processing system, according to some embodiments.

DETAILED DESCRIPTION

Figure 1A:
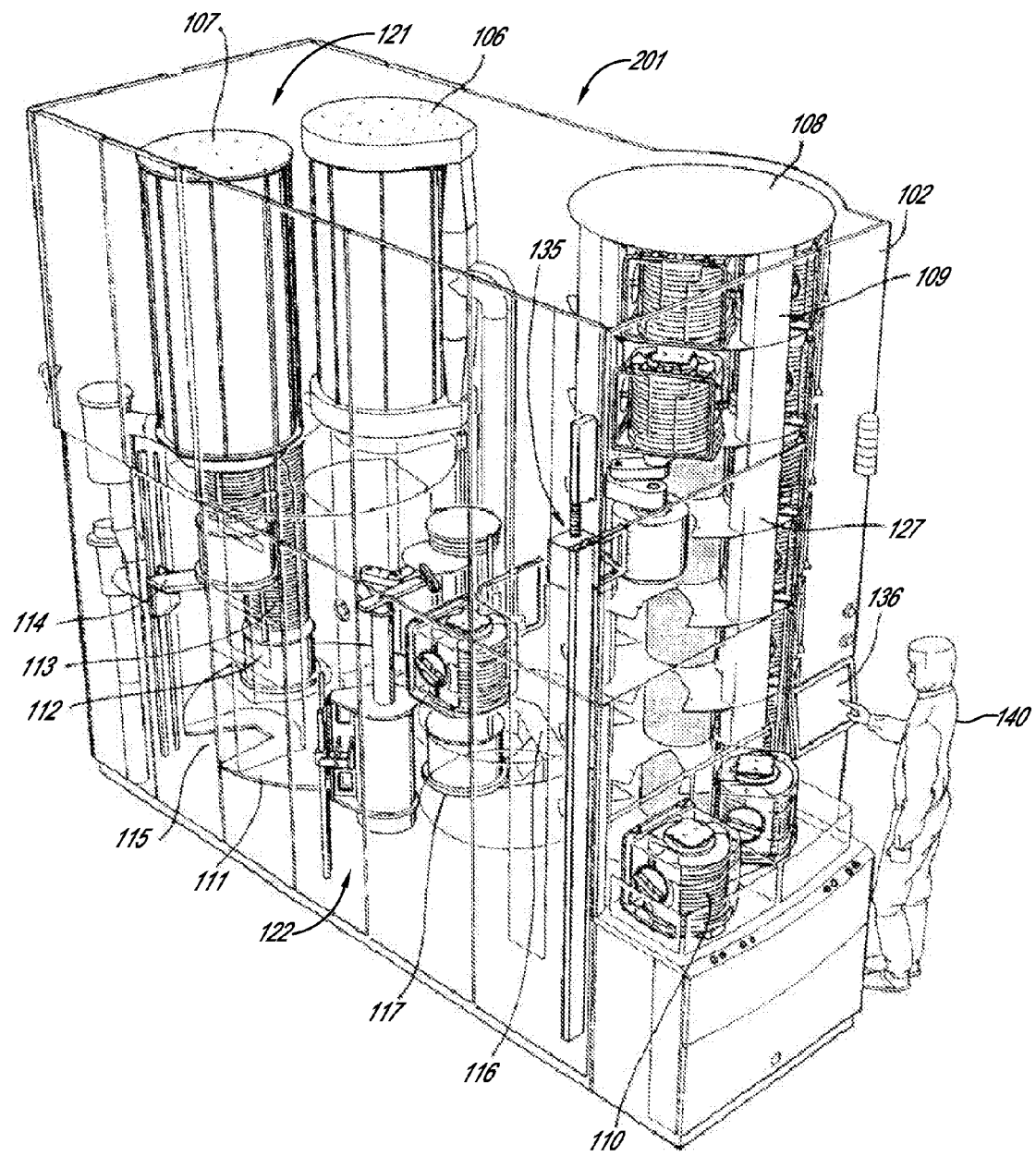
FIG. 1A is a schematic perspective view of a semiconductor processing system, according to some embodiments.

The following detailed description of certain embodiments presents various descriptions of specific embodiments of the invention. However, the invention can be embodied in a multitude of different ways as defined and covered by the claims. In this description, reference is made to the drawings, where like reference numerals indicate identical or functionally similar elements.

It will be appreciated that processing systems may comprise multiple substrate locations such as Input/Output locations, processing locations, storage locations and intermediate locations. Further, a processing system may comprise multiple devices for moving the substrates between the various locations. Scheduling the progression of substrates through the system can be done using various sequences, some of which are efficient, resulting in a large number of processed substrates in a particular amount of time, i.e., the throughput of the processing system, while others are inefficient and may lead to congestions, bottle necks or even dead locks. Various methods of scheduling have been used. In some methods, for example, an advance simulation is performed, prior to the operation of the system to determine the optimum scheduling sequence and then this sequence is executed. During execution no further adjustments are made. In examples of other methods, a controller uses a pre-sequencer or look ahead feature to identify congestions ahead of time and transfer substrates to a holding position and reschedule these substrates at the earliest time for completion of processing. However, these methods are not very flexible and are not able to provide a processing sequence that maintains desired processing goals, e.g., high throughput, under varying circumstances, e.g., when processing circumstances unexpectedly change. Advantageously, various embodiments disclosed herein provide a scheduler for a processing system that can perform and adjust a sequence to maintain desired processing goals under varying circumstances. In some embodiments, the processing goals, and thus the sequence to be performed, may be changed in the midst of performing a sequence in response to changes in processing circumstance.

Embodiments disclosed herein relate to systems and methods for scheduling processes and/or actions of a processing system. As explained herein, a wafer or substrate may undergo numerous processes at different processing stations in order to manufacture a finished wafer or substrate. Electronic controllers or schedulers may be used to automate the process flow for substrates in one or more boats (also referred to herein as boat racks) in order to improve system throughput. Because it may be desirable to maintain high system throughput, there is a continuing need for controllers that are capable of scheduling the operation of the system that increases throughput, including, e.g., scheduling the movement and processing of boats of substrates.

For example, in some embodiments, a current state of the system or part of a system, e.g., reactor module in the system, may be determined. The current state may include the location and processing status of substrates in the system or part of the system, along with the status (e.g., position, task being performed, etc.) of equipment in the system or part of the system (e.g., robots, reactors, etc.). Based on the determined current state, a controller, e.g., a programmed processor, may generate a search tree having one or more branches of potential actions, with each branch identifying one or more subsequent actions that are capable of being performed by the system in the current state. Each branch may further branch off to one or more sub-branches including further subsequent actions. Each branch and sub-branches, if any, may form one or more branch pathways that indicate alternative, consecutive actions that may be performed by the system. Each branch pathways of the generated search tree may be scored based on whether and how much the branch pathway improves system throughput (or other desired criteria), and a branch pathway of the tree may be selected based at least in part on the score of the branch pathway. The system may then perform the actions in the selected branch pathway of the search tree. Accordingly, in some embodiments, system throughput and efficiency may be improved by using knowledge of the current system state and subsequent actions that may be performed when the system is in the current state.

Processing Systems

Figure 1B:
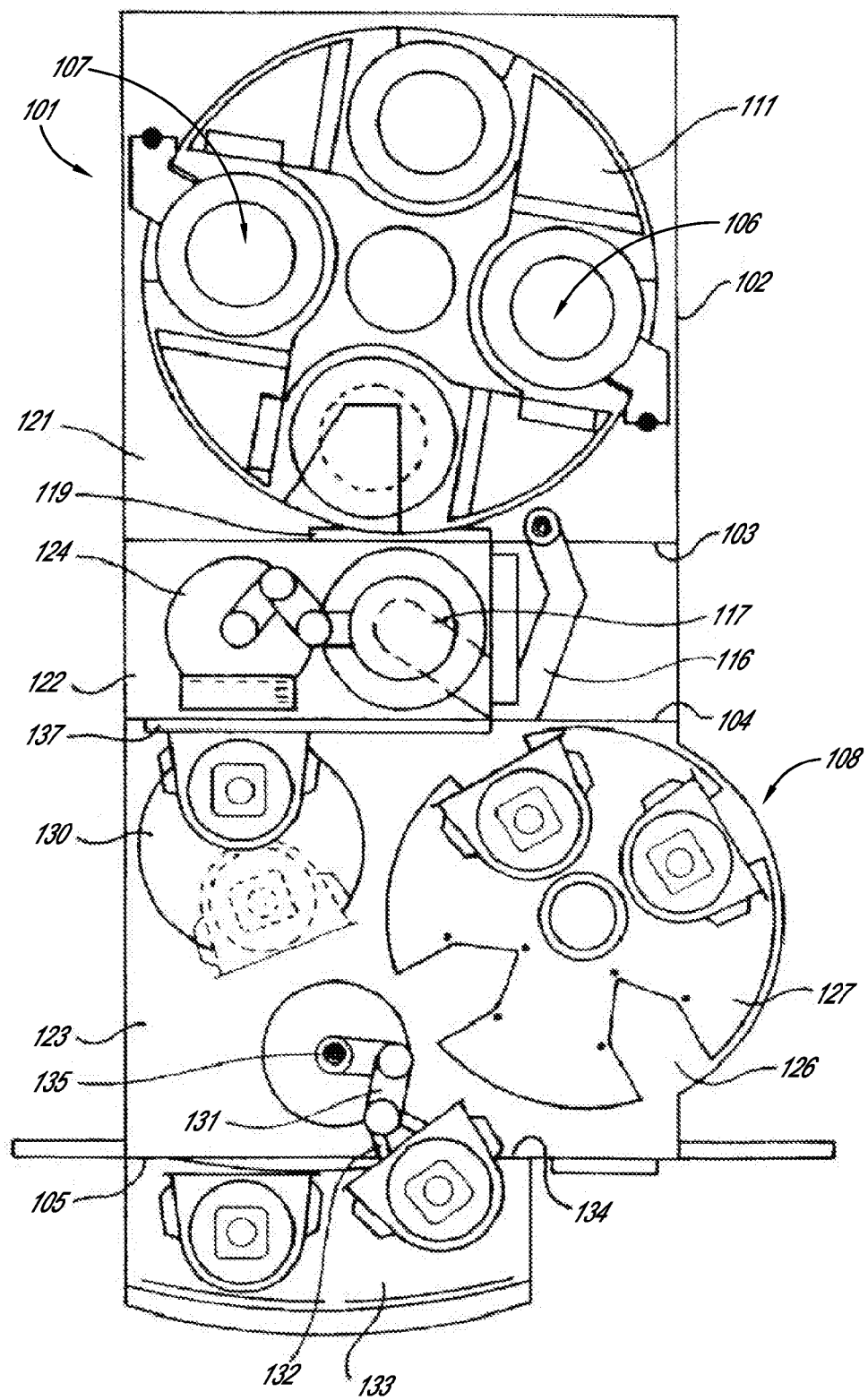
FIG. 1B is a top plan view of the semiconductor processing system of FIG. 1A, according to some embodiments.

FIGS. 1A and 1B illustrates an example of a semiconductor processing system 201 having two reactors, e.g., a dual reactor module (DRM), along with additional ancillary equipment, such as for moving and temporarily storing substrates. In particular, FIG. 1A is a schematic perspective view of the semiconductor processing system 201. FIG. 1B is a top plan view of the semiconductor processing system 201 of FIG. 1A. It should be appreciated that substrates may be processed in the system 201 in various orientations, including vertical or horizontal orientations, depending, e.g., on the type of substrate holder that is utilized. The substrates 113 are shown in FIG. 1A in a horizontal configuration. In some other embodiments, the substrate 113 may be processed oriented vertically.

The semiconductor processing system 201 comprises housing 102 and may in general have been installed in a so-called "clean room". The housing 102 may include a reactor area or chamber 121 in which various processes may be performed on a substrate. An intermediate storage chamber 122 may be located in the housing 102 between partitions 103 and 104. An initial storage chamber 123 may be located between partitions 104 and 105 in the housing 102. An Input Output station (IO station) 133 may be provided adjacent the initial storage chamber to introduce the substrates into the processing system 201.

The processing system 201 of FIG. 1A illustrates a dual reactor module (DRM), e.g., the system 201 includes two reactors, a first reactor 106 and a second reactor 107, arranged in the reactor chamber 121. In the embodiment shown in FIG. 1A, the first reactor 106 and the second reactor 107 are furnaces, although it should be appreciated that the reactors 106 and 107 may be any suitable reactor or processing station, including, but not limited to, deposition chambers, lithography stations, etching stations, etc. The reactors 106, 107 are positioned vertically and substrate boats 112 filled with substrates 113 may be introduced into the reactors 106, 107 in the vertical direction from below the reactors 106, 107. To this end each reactor may have an elevator 114, which is movable in the vertical direction. Only one elevator 114 associated with the second reactor 107 may be seen in FIG. 1A, although it should be appreciated that the first reactor 106 may also include an elevator 114. The boat 112 may be provided at the bottom with an insulating plug, which is not indicated in detail, which may provide a seal between the boat and the furnace.

As discussed herein, rotatable carousel 111, provided with cut-outs 115, may be positioned underneath the reactors 106, 107. The carousel 111 may include at least two carousel positions configured to support a boat of substrates. Further, the carousel 111 may be configured to transfer a boat 112 of substrates 113 between the first reactor 106 and the second reactor 107, or vice versa. For example, the carousel 111 may rotate by any suitable angle, e.g., 90 or 180 degrees, to move a boat 112 between the two reactors or to a boat transfer device 116, such as a robot arm. Those cut-outs 115 are shaped such that, if the cut-outs 115 have been brought into the correct position, the elevator 114 is able to move up and down through the cut-outs 115. On the other hand, the diameter of the bottom of the boat 112 may be such that the diameter is larger than the cut-out 115 in the carousel 111, so that when the elevator 114 moves downwards from the position shown in FIG. 1A the boat 112 may be placed on carousel 111 and may be removed therefrom again in a reverse operation.

The boats 112 may be fed to both the first reactor 106 and the second reactor 107, and various treatments may be performed therein. In some embodiments, parallel groups of boats 112 may be treated exclusively by the first reactor 106 and/or exclusively by the second reactor 107. The boats 112 may be provided with substrates 113. For example, substrates 113 may be supplied in transport cassettes 110 which, from the IO station 133, may be placed in storage station 108 through a closable opening 134 with the aid of arm 131. Arm 131 may include a bearing surface 132 which has dimensions smaller than those of a series of cut-outs 126 in a rotary platform 127. A number of such rotary platforms 127 may be provided one above the other in the vertical direction in storage station 108. The arm 131 may be movable in the vertical direction with the aid of height adjuster 135. Arm 131 may be mounted such that the arm 131 may pick up or remove cassettes 110 between the IO station 133 and the storage station 108. The arm 131 may also move cassettes between the storage station 108 and a rotary platform 130. The rotary platform 130 may be constructed such that on rotation the cassette 110 may be placed against partition 104 where an opening 137 has been made so that, after opening the cassettes 110, substrates 113 may be taken from the cassette 110 by substrate handling robot 124 and may be placed in the boat 112 located in the intermediate storage chamber 122. The boat 112, while located in intermediate storage chamber 122, may be supported by a boat transfer device 116 (e.g., a robotic arm) which may be provided with a bearing surface 117 at an end, the dimensions of which are once again somewhat smaller than those of cut-outs 115. The transfer device 116 may move the boat 112 through a closure 119 in partition 103 to place the boat 112 on the carousel 111 in the reaction chamber 121. The closure 119 is provided in order to be able to close off intermediate storage chamber 121 from the chambers 122 and 123.

To conduct various types of processing steps, an operator 140, shown diagrammatically in FIG. 1A, may load the storage station 108 by introducing a number of cassettes 110 and carrying out control operations on panel 136. Each of the cassettes 110 may be transferred from the IO station 133 with the aid of the arm 131 into storage compartments 109 made for these cassettes 110 in the storage station 108. This means that, starting from the position for removing the relevant cassette 110 from IO station 133 through the opening 134, the cassette 110 may then be moved upwards for moving into a higher compartment 109 of the storage station 108. By rotation of the storage station 108 it is possible to fill various compartments 109 with cassettes 110.

The cassettes 110 may then be removed from the storage station 108 by arm 131 and placed on rotary platform 130. The cassettes 110 may be rotated on the rotary platform 130 and placed against partition 104. With the aid of substrate handling robot 124, the substrates 113 may be removed and placed in substrate boat 112 placed on or near the boat transfer device 116. In the interim, as explained herein, the carousel 111 is able to move in the reaction chamber 121 with regard to the treatments to be carried out on the substrates 113 present inside the reaction chamber 121. After boat 112 has been filled in the intermediate storage chamber 122 and has become or becomes available to one of the reactors 106, 107, opening 119, which may be closed up to this time, is opened and the filled substrate boat 112 may be placed on carousel 111 using any suitable boat transfer device, such as the boat transfer device 116 (e.g., a robotic arm). The carousel 111 may then be rotated and the filled substrate boat 112 may be removed from the carousel 111 and moved up into one of the reactors 106 or 107. After treatment in the reactor(s) 106 and/or 107, the treated substrates 113 in a filled boat 112 may be removed from the reactors 106, 107 using movements opposite to those described above for loading the substrates 113 into the reactors 106, 107.

Figure 2B:
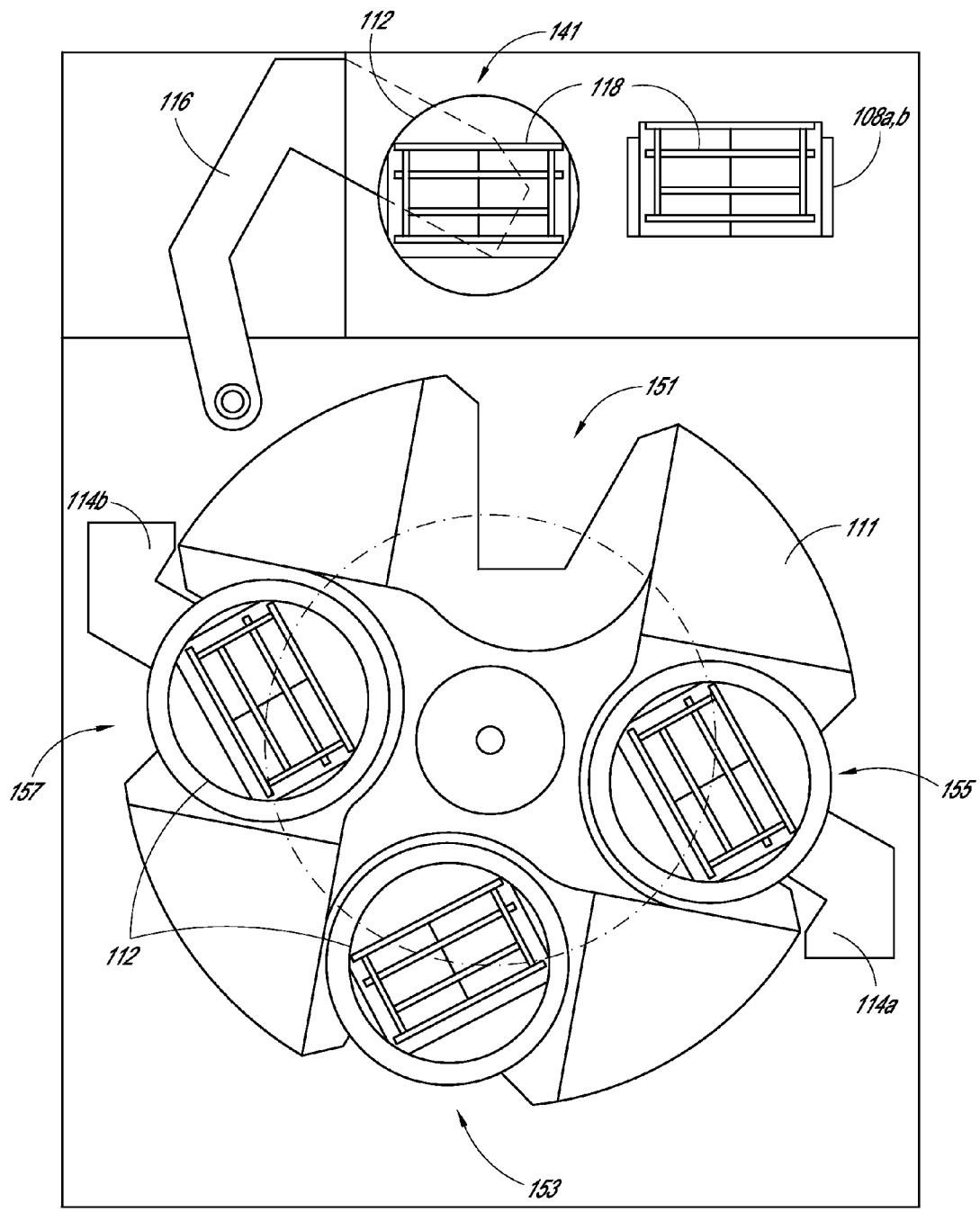
FIG. 2B is a plan view of a rotatable carousel and a boat transfer device, according to some embodiments

FIG. 2A-2E illustrate another example of a semiconductor processing system according to some embodiments. Thus, parts of the system 101 of FIGS. 2A and 2B may be similar to or the same as the system 201 of FIG. 1A. FIG. 2A is a schematic perspective view of a semiconductor processing system 101. The processing system may include a housing 102 that generally encloses the system components. The system 101 of FIG. 2A includes two dual reactor modules (DRMs). A first DRM may be housed within a first housing 102a, and a second DRM may be housed within a second housing 102b. Within the first housing 102a, the system 101 may include one or more reactors in a reactor chamber. As illustrated in FIG. 2A, the system 101 may include a first reactor 106a and a second reactor 107a in the first housing 102a to form the first DRM. Further, the system 101 may also include another first reactor 106b and another second reactor 107b in the second housing 102b to form the second DRM. In FIG. 2A, the first reactors 106a, 106b and the second reactors 107a, 107b are furnaces, such as for performing deposition processes, yet it should be appreciated that the reactors 106a, 106b, 107a, and 107b may be any other suitable processing station, including but not limited to a single substrate reactor, an etching station, lithographic machines, etc. Rotatable carousels 111a and 111b may be disposed below each pair of reactors 106a and 107a, and 106b and 107b.

A manipulator 165, such as a multi arm robot, may be configured to transport substrates between storage stations 108a, 108b, 108c, 108d and boats 112a, 112b located at exchange positions 141a and 141b. Each boat 112 may hold a number of substrate holders 118, each substrate holder 118 accommodating a batch of substrates 113 as further illustrated in FIG. 2C-2E. The manipulator 165 or other system machinery may move the substrate holders 118 with substrates between the storage stations 108a-108d and each respective boat 112a and 112b positioned at the exchange positions 141a and 141b. As shown in FIG. 2A, boats 112a and 112b holding a plurality of substrate holders 118 with batches of substrates (e.g., semiconductor substrates, including substrates for forming integrated circuits and/or solar cells and related devices) may be positioned in exchange positions 141a and 141b before being transported to the reactors for processing. In some embodiments, the boats 112a and 112b may hold 10 or more, 50 or more, or 100 or more substrates (see, e.g., FIGS. 2D and 2E). Once the substrate holders 118 with substrates 113 are loaded on the boats 112a and 112b, the boats 112a and 112b may be loaded onto the carousels 111a, 111b, and the carousels 111a and 111b may be rotated to position the boats 112a and 112b underneath the reactors 106a, 106b, 107a, or 107b. In various embodiments, a boat transfer device (not shown in FIG. 2A; see e.g., FIGS. 1A and 4, robotic arm 116) may move the boats 112a and 112b between the exchange positions 141a, 141b and the carousels 111a, 111b. In other embodiments, the carousels 111a, 111b may include a carousel position beneath the exchange positions 141a, 141b, such that no separate boat transfer device is needed to move the boats 112a, 112b from the exchange positions 141a, 141b to the carousels 111a, 111b.

Elevators (not shown; see, e.g., FIG. 4) may be employed to raise the boats 112a and 112b through an opening into the reactors 106a, 106b, 107a, and 107b for processing. When processes in the reactors 106a, 106b, 107a, and 107b are completed, the elevators may lower the boats 112a and 112b to the carousels 111a and 111b, and the processed substrates in the boats 112a and 112b may be unloaded from the boats 112a and 112b for further processing. Once the substrates are added or removed from the boats 112a and 112b, the carousels 111a and 111b may rotate the boats 112a, 112b into a suitable position for processing.

An Input Output station (IO station) 133 comprising the storage stations 108c, 108d may be provided to introduce the substrates into the processing system 101. The system 101 may also include a controller 120, which may include a computer having a processor and memory. The controller 120 may be in electrical communication with the various processing system components described herein, or may be configured to communicate with the various components to provide operational instructions to those components. An operator may use an interface panel 136 to operate or provide instructions to the controller 120. In operation, in some embodiments, the operator may initiate a desired processing sequence using the interface panel. For example, the manipulator 165 may load a boat 112a, 112b with substrate holders 118 filled with unprocessed substrates 113 and/or the boat transfer device 116 may exchange a boat 112a, 112b of processed substrates to exchange stations 141a, 141b where the processed substrates can be exchanged with unprocessed substrates. Once loaded with a boat 112a, 112b of unprocessed substrates, boat transfer device 116 may transfer the boat 112a, 112b from the exchange position to a front position of a carousel 111a, 111b. The carousel 111a, 111b may then be rotated by a suitable angle, e.g., 90 degrees, to position the boats 112a, 112b underneath the reactors 106a, 106b, 107a, or 107b. The elevators may then raise the boats through the openings and into the reactors 106a, 106b, 107a, or 107b for processing. After processing, the boats 112a, 112b may be removed from the reactors 106a, 106b, 107a, or 107b and the system 101 by lowering the processed boats 112a, 112b onto the carousels 111a, 111b using the elevator. The carousels 111a, 111b may rotate the boats 112a, 112b to the front position of the carousels 111a, 111b, and the boat transfer device may transfer the processed boats 112a, 112b from the carousels 111a, 111b to the exchange positions 141a and 141b, where the substrate holders with processed substrates may be unloaded from the boats 112a, 112b, by manipulator 165, to, e.g., storage positions 108c, 108d in the IO station 133. The substrate holders 118 with substrates may then be removed from the system 101 for further processing.

FIG. 2B is a top plan view of a DRM of the system 101 shown in FIG. 2A. As shown in FIG. 2B, the carousel 111 may include four carousel positions. For example, the carousel 111 may include a front carousel position 151 configured to receive a boat 112 of substrates from the boat transfer device 116. The boat transfer device 116 may include a robotic arm having any suitable number of degrees of freedom. The boat transfer device 116 may support the boat 112 of substrates and at the exchange position 141 may move the boat 112 into the front carousel position 151 from the exchange position 141. As explained herein, processed substrates may be exchanged for unprocessed substrates at the exchange position 141. The carousel 111 may also include a first reactor carousel position 155 and a second reactor carousel position 157. The first reactor carousel position 155 may be positioned underneath the first reactor 106, and the second reactor position 157 may be positioned underneath a second reactor 107, such as, e.g., the second reactor 107 disclosed above with respect to the embodiment of FIG. 2A. When the boat 112 is received in the front carousel position 151, the carousel 111 may be rotated by 90 degrees clockwise to position the boat 112 underneath the first reactor 106 or by 90 degrees counterclockwise to position the boat 112 underneath the second reactor 107. For example, if the boat 112 is rotated into the first reactor carousel position 155, a first boat elevator 114a may be used to raise the boat 112 into the first reactor 106. If the boat 112 is rotated into the second reactor carousel position 157, then a second boat elevator 114b may be used to raise the boat 112 into the second reactor 107 for processing. In various embodiments, the carousel 111 may include a rear carousel position 153 near the rear of the carousel 111. The rear carousel position 153 may be used to hold boats 112 in a standby position. In various embodiments, the boats 112 may be cooled while in the rear carousel position 153. In other embodiments, the carousel 111 may only include two or three positions, while in yet other embodiments, the carousel 111 may include more than four carousel positions.

Figure 2C:
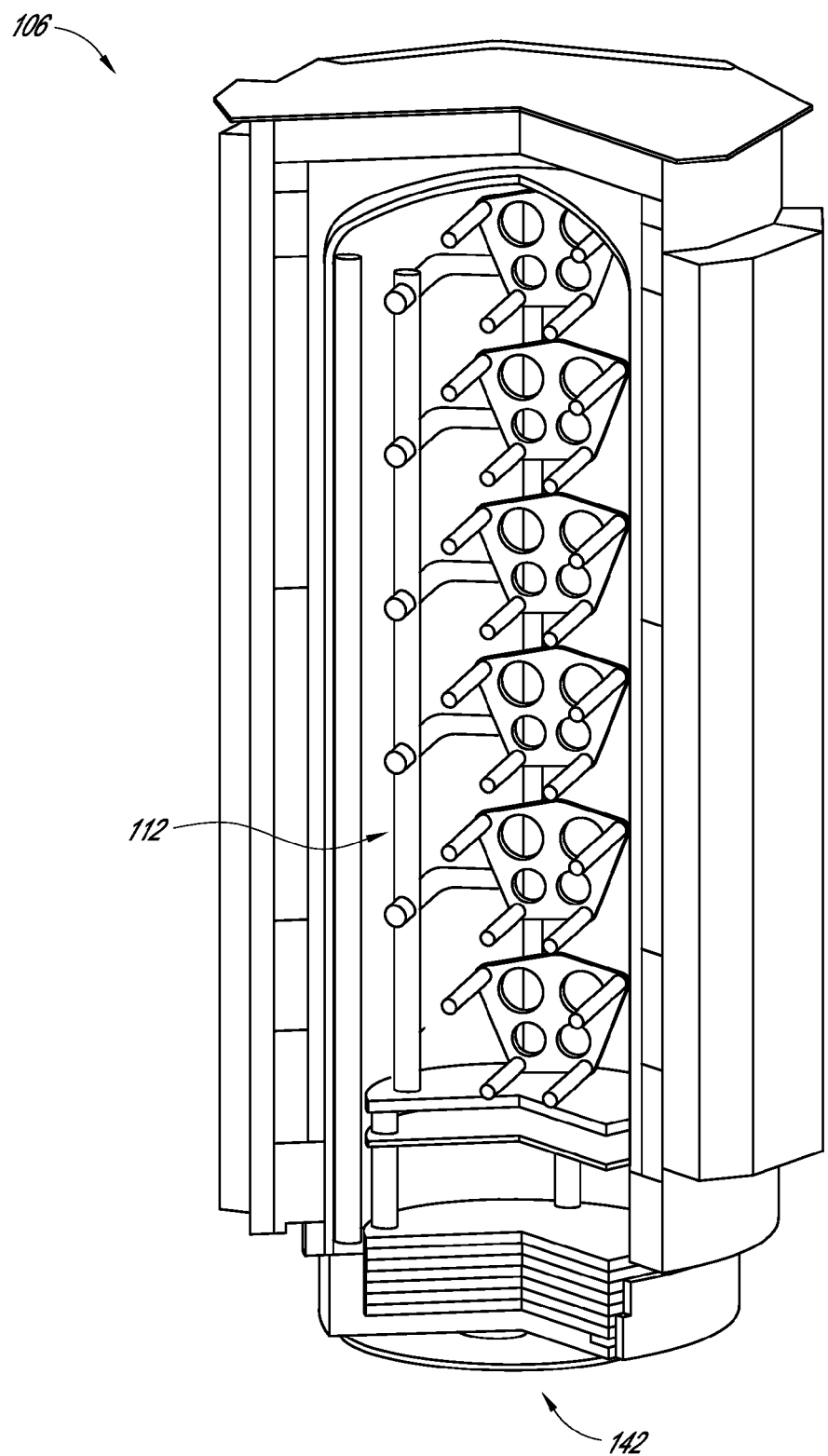
FIG. 2C is a schematic perspective view of a reactor, according to some embodiments.
Figure 2D:
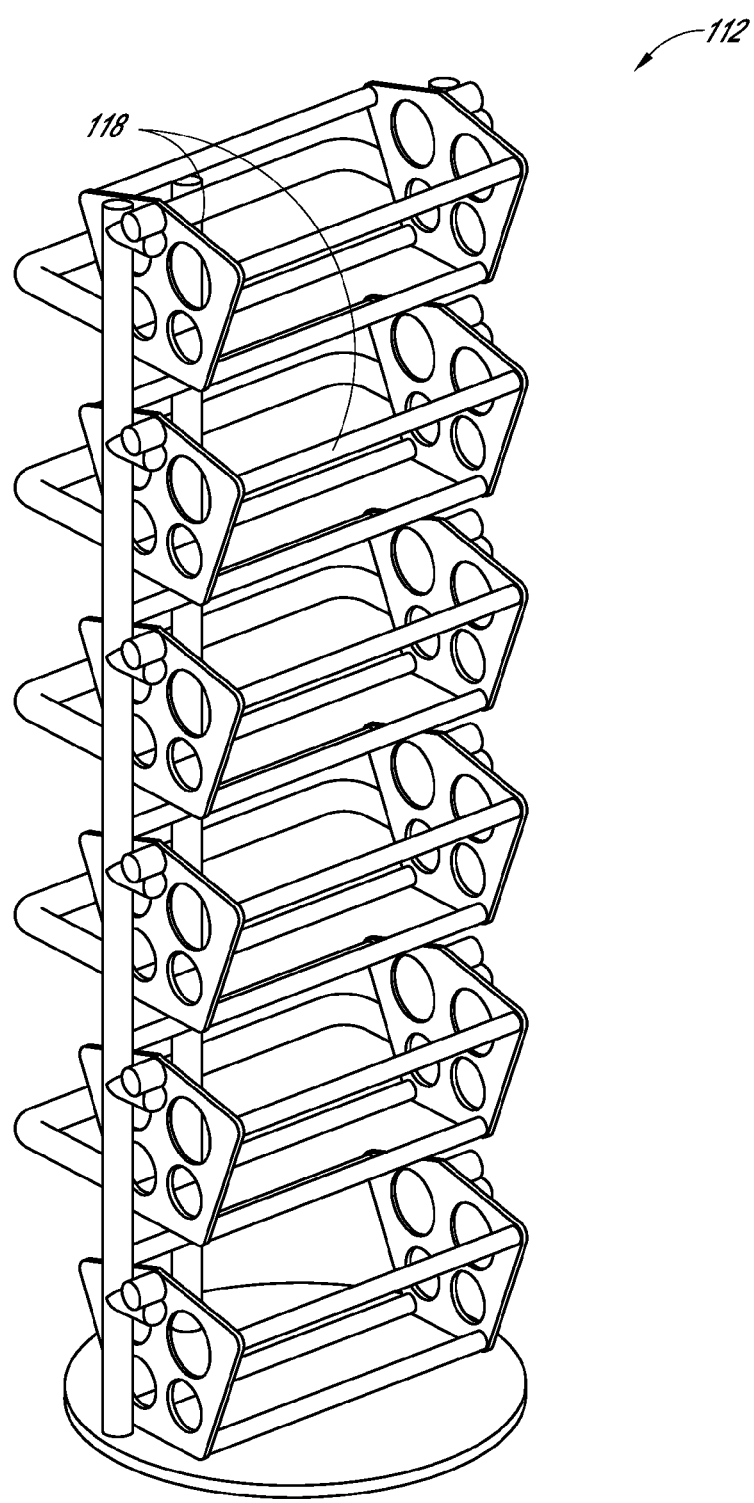
FIG. 2D is a schematic perspective view of a substrate boat rack, according to some embodiments.

FIGS. 2C and 2D illustrate perspective views of a reactor 106 and a boat 112 that may be used in conjunction with the system 101 of FIG. 2A. For example, the reactor 106 may be implemented as the reactors 106a, 106b, 107a, or 107b in the system of FIG. 2A. The reactor 106 and the boat 112 may also be used in other embodiments disclosed herein. The reactor 106 of FIG. 2C may be used in various embodiments for processing solar cell substrates. In some other embodiments, the reactor 106 may be used to process integrated circuits. As shown in FIG. 2D, for example, the boat 112 may include multiple substrate holders 118 configured to support an array of substrates 113 (FIG. 2A). The boat 112 may be moved vertically through the opening 142 into the reactor 106 for processing.

Figure 2E:
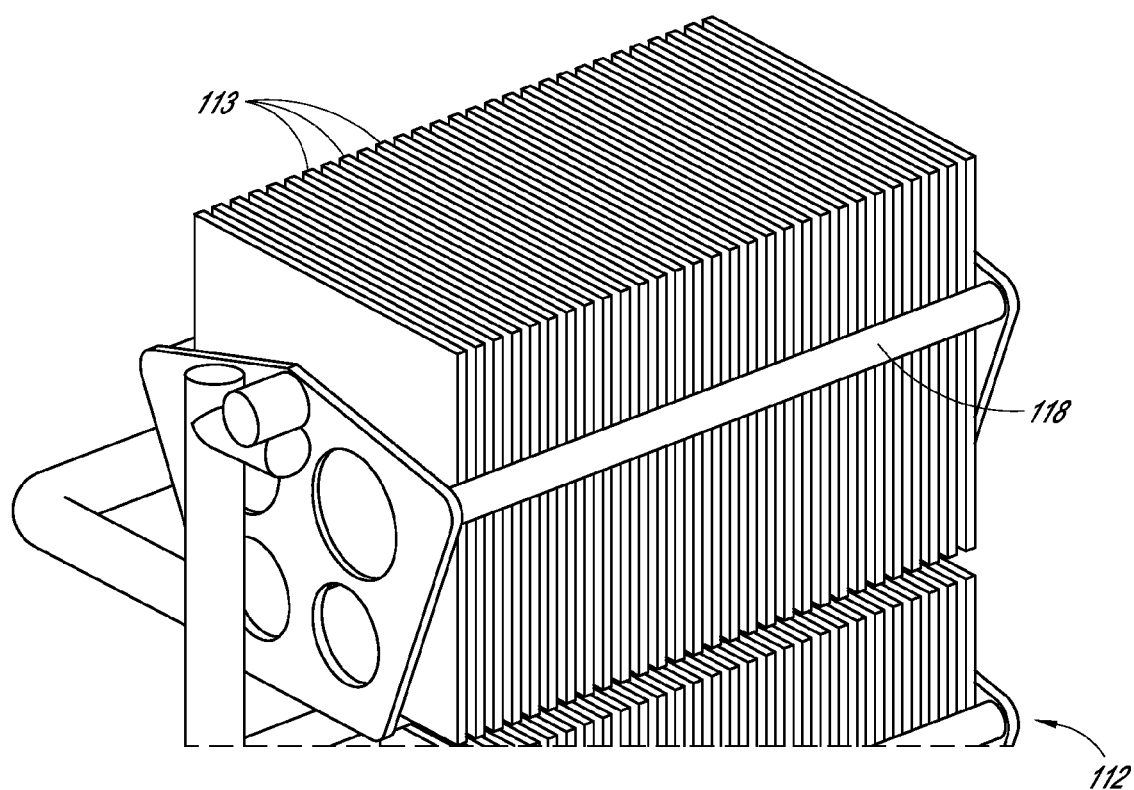
FIG. 2E is a schematic perspective view of a cassette of substrates loaded onto a substrate boat, according to some embodiments.

FIG. 2E is a schematic perspective view of a batch of substrates 113 loaded onto the boat 112. The illustrated substrates 113 are square or rectangular in shape, but it should be appreciated that the substrates 113 may be any suitable shape, such as circular. In addition, the illustrated substrates 113 may be solar cell substrates, but they may also be integrated circuit substrates or any other suitable substrate. The substrates 113 may be vertically oriented on the substrate holder 118 in FIG. 2E.

Those skilled in the art will understand that numerous modifications to the above are possible. For instance, it is possible for one reactor to suffice, or for more than two reactors to be present. The storage station may be of different construction, and the various displacement mechanisms transfer devices and manipulators may likewise be adjusted depending on the system parameters.

Systems and Methods for Scheduling the Processing of Substrates

As shown with respect to FIGS. 1A-1B and 2A-2E, substrates at various stages of processing may be moved from station to station by various mechanisms. In order to provide a high throughput, it may be advantageous to organize the movement of substrates (e.g., substrates loaded in boats) between processing stations and related equipment in the system based on the current state of the system, to provide efficient processing. For example, when a boat is undergoing processing in a reactor, typically no other boats may be introduced into the reactor. However, in order to efficiently operate the system, other actions may be taken while the boat being processed is in the reactor. For example, a subsequent boat may be loaded onto the boat transfer device, or a recently processed boat may be rotated into the rear carousel position in order to allow substrates in that boat to cool down. In sum, throughput may be advantageously increased by efficiently organizing the movement and processing of the boats through the system.

As an overview, in various embodiments, the controller 120 (as shown, e.g., in FIG. 2A) may schedule the processing sequence and movement of substrates based on a current state of the processing system. In general, at any arbitrary moment in time during a processing sequence, the controller 120 may determine what actions the system may take when it is in the current state, e.g., whether it is able to move a boat into the reactor or remove a boat from a reactor, or whether a boat of substrates may be exchanged in the exchange position. Additional actions may be possible, as explained herein. Each possible action may be simulated by the controller 120, and the controller may create a search tree of all possible subsequent actions. The controller 120 shown in FIG. 2A may be programmed to control one or more DRMS, e.g., both DRMs shown in FIG. 2A, including the reactors in both housings 102*a* and 102*b* and manipulator 165. In other arrangements, however, each DRM may have its own controller. For example, a first controller can control the operation of the reactors 106*a*, 107*a* in the first housing 102*a*, and a second controller can control the operation of the reactors 106*b*, 107*b* in the second housing 102*b*. In various embodiments, the controller may systematically investigate the search tree for a pre-determined time horizon, or "look-ahead time." Each branch of the search tree may be scored, and the branch with the best score may be selected. The actions in the selected branch may then be performed by the system. Thus, the system controller may schedule the processing sequence in real-time, based on the current state of the system and based on simulated subsequent states of the system, the simulation extending to states within a particular pre-determined time horizon.

Figure 3:
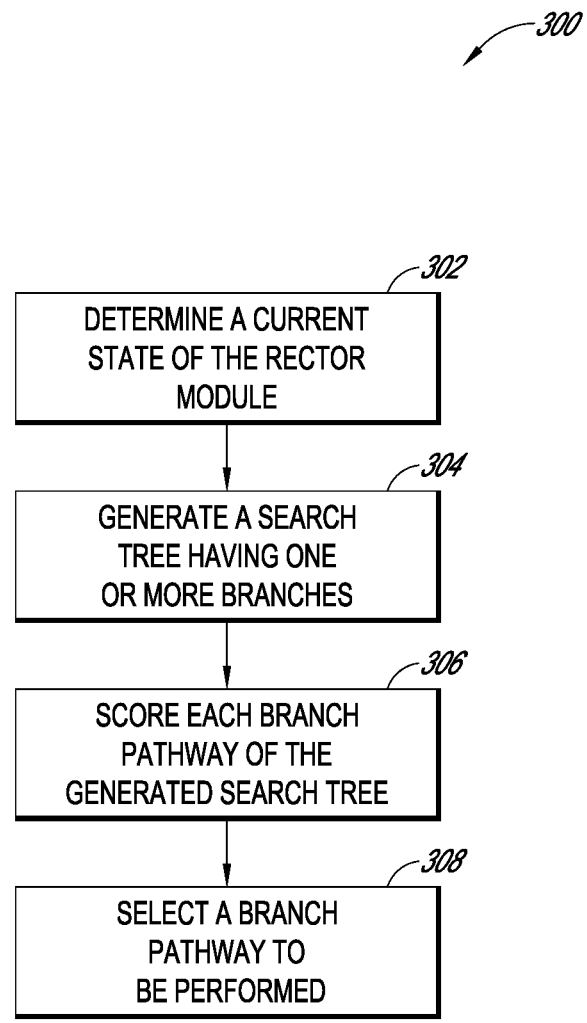
FIG. 3 is a flowchart illustrating one method for scheduling and controlling the operation of a processing system, according to some embodiments.

FIG. 3 is a flowchart illustrating one method 300 for scheduling and controlling the operation of a processing system, e.g., the various components in the system associated with the reactor(s) and processing system. For example, the method 300 may begin in a block 302 to determine a current state of the system. In general, the state of the system may be defined at least by a location of one or more boats and a processing status of each of the one or more boats. In addition, in various embodiments, the state of the system may be further defined by the status of other equipment in the processing system and may also include a time component. For example, the time component may include an amount of time until a reactor is available to receive a boat and/or by an amount of time until a boat is scheduled to leave one of the reactors (e.g., after processing). Further, the current state may be based on an amount of time in which a process is scheduled to continue in one of the reactors. For example, the state may be defined in part by the determination that Boat 1 in Reactor 1 has 10 minutes of processing time left, while Boat 2 in Reactor 2 has finished processing; for example, the substrates in Boat 2 may have 2 minutes of cool-down time left, or another boat may be in Boat 2's next position such that it prevents Boat 2 from moving for another 2 minutes. The state of the system may also be defined in part by the position of the elevator(s). For example, the elevator may be in an up position near the reactor, in a down position near the carousel, or in an intermediate position while it moves upward or downward. Further, the state of the system may be determined based on an amount of time that each boat is scheduled to cool down after a process, e.g., after unloading a hot boat from a reactor the boat is scheduled for a subsequent cool-down period before removing of the substrates from the boat. Moreover, the state of the system may be defined in part by the orientation of the carousel, e.g., which carousel positions are currently supporting boats and/or the processing status of the boat(s) on the carousel. In other embodiments, e.g. an embodiment wherein the processing system is a single wafer cluster tool, the state may be defined by a location of one or more substrates and a processing status of the one or more substrates. In addition, in such embodiments, the state of the system may be further defined by the status of other equipment in the processing system including reactors and moving parts such as robots, and may also include a time component related to the amount of remaining processing time, etc.

Figure 4:
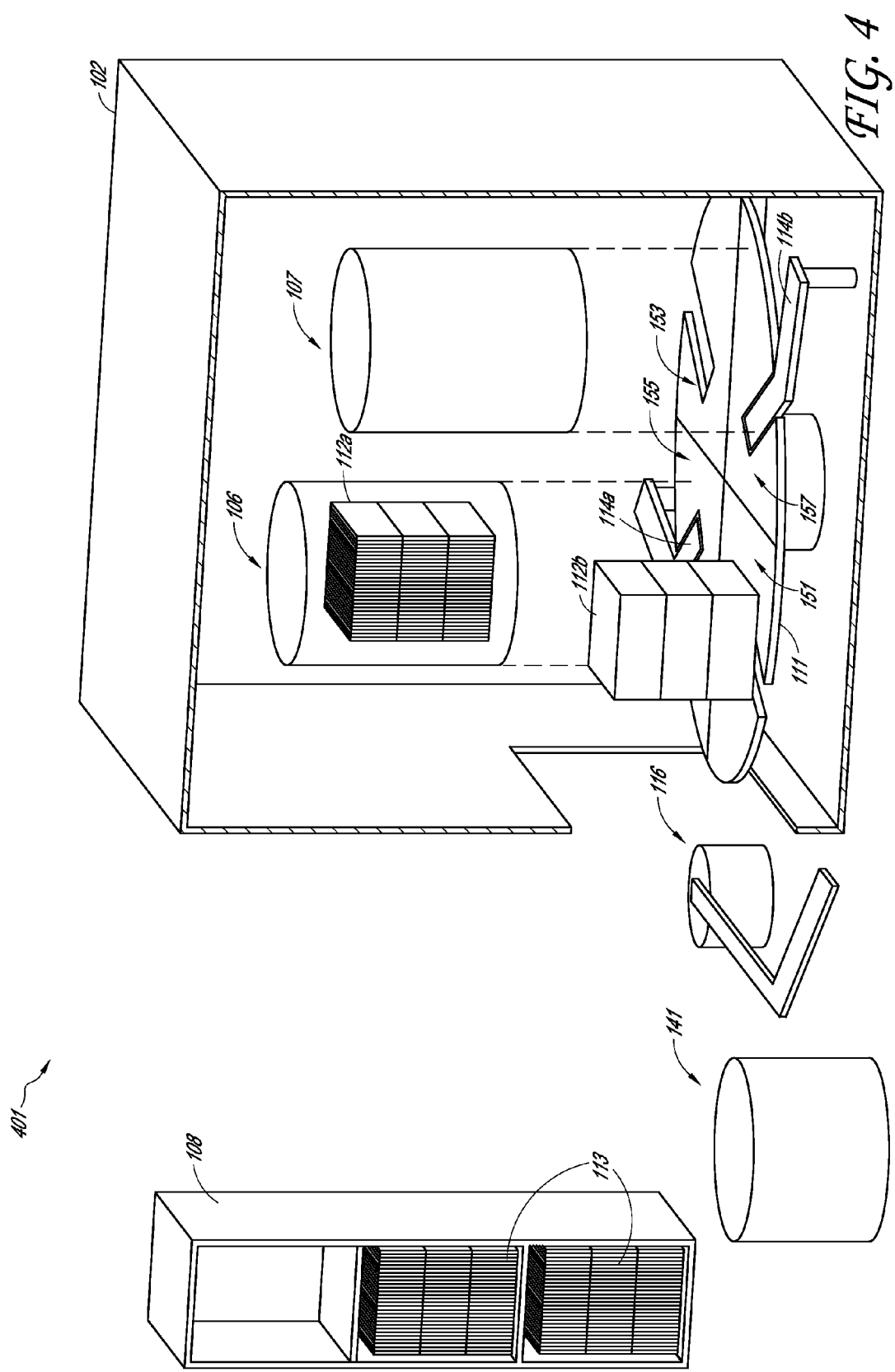
FIG. 4 is a schematic perspective view of a processing system in a particular current state, according to some embodiments.

FIG. 4 schematically illustrates a processing system 401 in a particular current state. As in FIGS. 1A-1B and 2A-2E, the system 401 may include a boat transfer device 116 positioned between an exchange position 141 and the housing 102. A storage station 108 may be positioned adjacent the exchange position, such that substrates may be moved between the storage station 108 and the exchange position 141. Multiple boats 112 may be located within the system 401, but for the purposes of this example, only a first boat 112*a* and a second boat 112*b* will be considered. For example, the state of the system 401 illustrated in FIG. 4 may be defined by the location and processing status of the first boat 112*a* and the location and processing status of the second boat 112*b*. For the purposes of FIG. 4, the first boat 112*a* is undergoing a standby process in the first reactor 106 after completing a processing step, and the second boat 112*b* is an empty boat and is positioned in the front carousel position 151 of the carousel 111. As shown, both elevators 114*a* and 114*b* are in the "down" position.

The method 300 (FIG. 3) proceeds to a block 304 to generate a search tree having one or more branches. As explained herein, each branch of the tree may identify one or more subsequent actions that are capable of being performed when the system is in the current state. For the purposes of simplicity with respect to the example of FIG. 4, the presence of the second reactor 107 and its boat elevator 114*b* will be ignored. However, it should be appreciated that the disclosed scheduling processes may be carried out with multiple reactors, resulting in a larger tree with a greater number of branches and possible actions.

Figure 5:
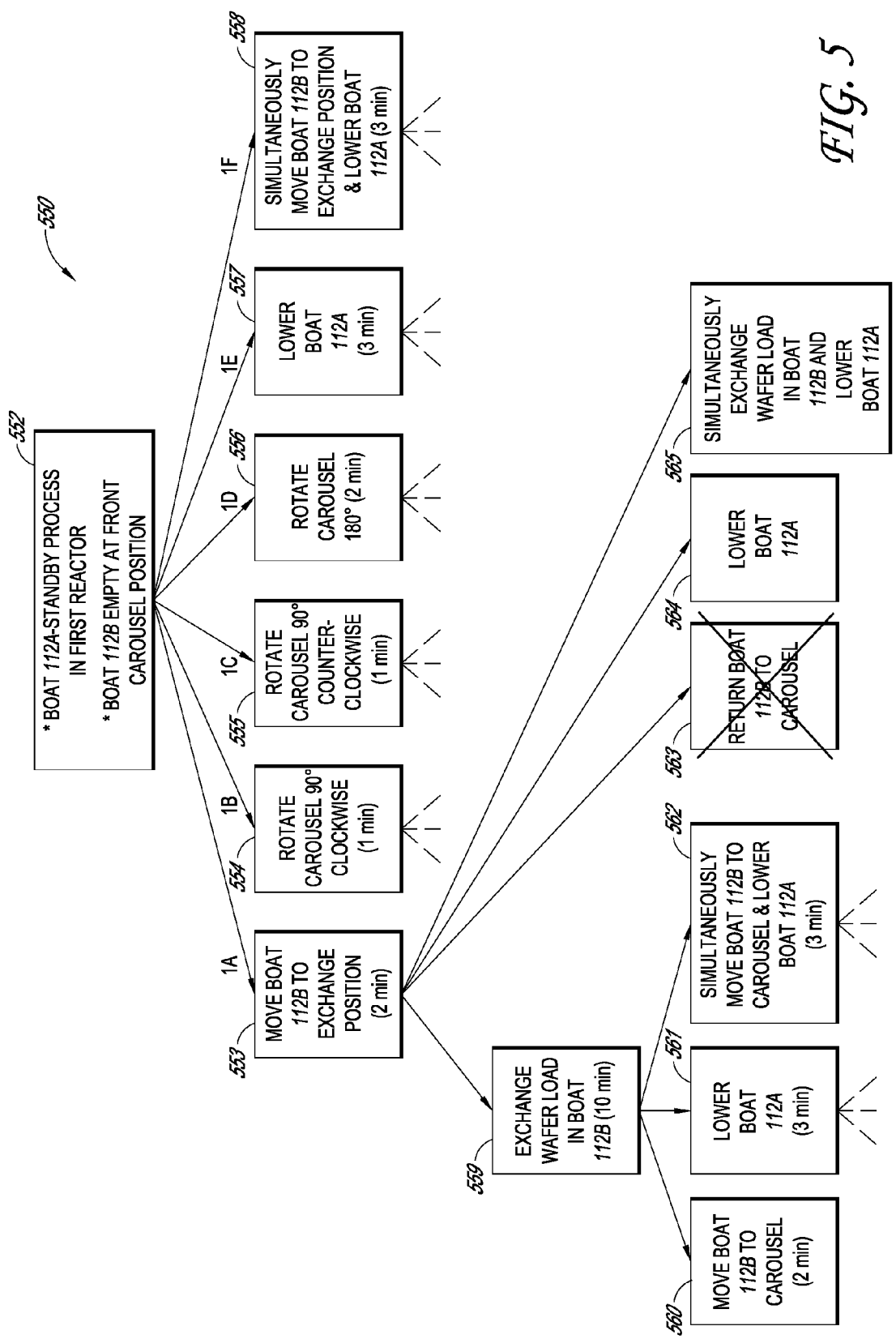
FIG. 5 illustrates an example search tree for the current state of the system illustrated in FIG. 4.

Ignoring the second reactor 107, FIG. 5 illustrates an example search tree 550 given the current state of the system 401 illustrated in FIG. 4. The controller may generate the search tree 550 for a pre-determined time horizon. Without a pre-determined time horizon, the controller may look ahead in the tree 550 for an exceptionally long period of time such that the number of potential actions may grow exponentially with the time horizon, which may increase controller processing time. By limiting the time horizon, the controller may create a manageable time window within which to analyze the potential actions to be taken, which may both decrease processing time and facilitate the ability to perform real-time analysis that allows next actions to be selected in the midst of a processing sequence. The pre-determined time horizon may be any suitable amount of time. For example, the time horizon may be in a range of about 10 minutes to about 45 minutes. In other embodiments, the time horizon may be in a range of about 15 minutes to about 35 minutes. In some embodiments, the time horizon may be selected based upon the duration of a particular process, e.g., the time required to perform a particular process, such as a deposition of a layer of material on substrates in a boat. In the example of FIGS. 4 and 5, a time horizon of 15 minutes is used to generate the search tree 550. Thus, the controller will look ahead to all possible actions that may be initiated within the time horizon of 15 minutes. Note that some actions may not be capable of being performed, e.g. lowering a boat from a reactor while a boat is already present at the carousel position below the reactor, or inserting a boat into a reactor in which another boat is already present. Such actions are excluded from consideration in executing block 304. Further, note that, in some embodiments, useless or non-productive actions may not be considered in executing block 304 of the method 300. Because one objective of the disclosed embodiments may be to improve system throughput, the controller may only consider actions that advance the processing of substrates, e.g., the controller may not consider trivial actions that, while theoretically possible to perform, do not advance the processing of substrates in the system. For example, rotating an empty carousel or placing a boat on the carousel immediately after removing it may not be considered. Generally, any actions that bring the system into a previously visited state are considered as non-productive. These actions, while theoretically possible in a current state, do not impact the processing of substrates.

In FIG. 5, block 552 illustrates the current state of the system, for example, the current state as shown in the system snapshot illustrated in FIG. 4. In the current state, the first boat 112a is undergoing a standby process in the first reactor 106 (FIG. 4) after having completed a processing step in the reactor 106. In addition, the second boat 112b is empty and positioned at the front carousel position 151. As shown in FIG. 5, there are various possible actions (e.g., five actions that are not useless or non-productive) that the controller could select given that the system is in the current state shown in FIG. 4. Each branch may be generated by associating each possible action with a branch of the one or more branches of the search tree 550. Thus, each possible action in the current state may correspond to one branch of the tree 550, e.g., Branch 1A, Branch 1B, Branch 1C, Branch 1D, Branch 1E or Branch 1F. Each branch may further branch off to one or more sub-branches including one or more subsequent actions; alternatively, each branch may only include one action. Thus, as used herein, a branch may refer to the initial actions that may be performed when the system is in the current state. Each branch may include one or more sub-branches that correspond to one or more subsequent actions, or further actions based on those subsequent actions.

Each branch and possibly a string of consecutive sub-branch(es) may form one or more branch pathways, each branch pathway formed of a string, or sequence, of consecutive actions that may be performed by the system. Indeed, as shown in FIG. 5, each branch pathway can include multiple levels of consecutive actions. Each of the sub-branches and actions within a branch may have an associated duration, corresponding to the time needed to perform all actions in a branch or a particular action, respectively. Also, each branch may have a single associated action, or a plurality of actions if the actions are performed together. For example, a branch pathway may refer to a path of consecutive actions that may be taken during the pre-determined time horizon. For example, FIG. 5 illustrates six branches—Branches 1A, 1B, 1C, 1D, 1E and 1F. An example branch pathway may begin in the current state, e.g., block 552, and may proceed to blocks 553, 559, and 562, at which point the time horizon is complete. It should be appreciated that many other branch pathways are possible for the current state shown in block 552.

In sum, as explained herein, a branch (e.g., Branches 1A-1F) may describe an action that the system can take in the current state. Each branch may include one or more sub-branches extending from the branch. A branch pathway can be formed by a string of one or more consecutive actions. For example, one branch pathway may include the three consecutive actions given by blocks 553, 559, and 562. Another branch pathway may include the three consecutive actions given by blocks 553, 559, and 560. Still another branch pathway may include the two consecutive actions given by blocks 553 and 559, for example, in embodiments where the pre-determined time horizon does not extend beyond block 559. Indeed, yet another branch pathway may be defined by the single action taken in block 558, for example, in embodiments where the pre-determined time horizon does not extend beyond block 558. Thus, the branch pathways can define one or more consecutive actions that may be selected and taken by the system, and the tree 550 can define the collection of all possible branch pathways for a given time horizon.

As a further example, Branch 1A may begin with a block 553, in which the second boat 112b of FIG. 4 may be moved by the transfer device 116 to the exchange position 141. As shown in the block 553, transferring the boat 112b to the exchange position 141 in FIG. 4 may take about 2 minutes. For Branch 1B, a block 554 may include rotating the carousel 111 by 90 degrees clockwise, which may take about 1 minute in various embodiments. For Branch 1C, a block 555 may include rotating the carousel 111 by 90 degrees counterclockwise, which may also take about 1 minute. For Branch 1D, a block 556 may include rotating the carousel 111 by 180 degrees, e.g., to move the second boat 112b to the rear carousel position 153, which may take about 2 minutes. Alternatively, in Branch 1E and in a block 557, the first boat 112a may be lowered by the elevator 114a, which may take about 3 minutes to complete. Finally, in Branch 1F and in block 558, the actions of Branch 1A and Branch 1E may be started simultaneously.

For each branch of the tree 550, the controller may be configured to determine a subsequent state of the system if the action associated with the branch is performed. The subsequent state of the system may be based on the factors explained above with respect to the current state, including, e.g., the location and processing status of the one or more boats of the system. As with the initial actions, the subsequent state may be analyzed to determine a set of actions (e.g., actions that are not useless or non-productive) that are capable of being performed when the system is in the subsequent state. For example, as shown in the tree 550 of FIG. 5, if Branch 1A were to be selected by the controller, then the second boat 112b would be moved by the transfer device 116 to the exchange position 141. For Branch 1A, therefore, the subsequent state of the system associated with a branch pathway leading to block 553 would be such that the second boat 112b is empty and positioned at the exchange position 141, while the first boat 112a remains in the first reactor 106 undergoing the standby process.

In the subsequent state, e.g., after executing the step of block 553, there are multiple actions that can be performed by the system. One option, shown in a block 559, is to exchange the substrate load of the second boat 112b at the exchange position 141. As shown in FIG. 5, alternative actions to block 559 include: (a) return boat 112b from the exchange position to the carousel (block 563); (b) lower boat 112a (block 564); or (c) simultaneously exchange substrate load of boat 112b and lower boat 112a. It should be noted that action (a) in block 563 is an example of a useless action as it returns the system to a previous state, without any progress. Useless actions may be excluded, thus block 563 is not considered as a potential subsequent action in some embodiments.

As an example of a branch pathway of FIG. 5, a particular branch pathway may begin in block 553 and continue to block 559. Therefore, the controller may direct the system from block 553 of Branch 1A to block 559. Thus, in the branch pathway leading to block 559, a load of unprocessed substrates may be loaded into the second boat 112b at the exchange position 141, which may take about 10 minutes. So far, therefore, the actions in blocks 553 and 559 have taken a total of 12 minutes (e.g., 2 minutes to move the second boat 112b to the exchange position 141 and 10 minutes to exchange the substrate load). Because the time horizon or look-ahead time is 15 minutes, the controller may continue generating additional sub-branches off of the block 559 by analyzing the actions that are possible now that the system is in the next state, e.g., that the second boat 112b has been loaded with a new batch of unprocessed substrates.

In light of the subsequent state of the system after performing the steps of block 559, e.g., after traversing the branch pathway leading from block 553 to block 559, there may be three additional possible actions, or branch pathways. First, in the branch pathway traversing block 560, the second boat 112b in FIG. 4 may be moved by the boat transfer device 116 to the carousel 111, which may take about 2 minutes. Or, in the branch pathway leading to a block 561, the first boat 112a in the first reactor 106 of FIG. 4 may be lowered using the first elevator 114a, which may take about 3 minutes. Alternatively, in the branch pathway going to a block 562, the actions of block 560 and 561 may be performed in parallel or simultaneously. Thus, in block 562, the controller may direct the system to simultaneously move the second boat 112b to the carousel 111 and to lower the first boat 112a using the elevator 114a, which may take 3 minutes due to the 3 minutes used to lower the first boat 112a. If the steps in block 562 are executed, then the time horizon of 15 minutes is reached, because performing blocks 553 (2 minutes), 559 (10 minutes), and 562 (3 minutes) equals the pre-determined time horizon of 15 minutes total. Note, however, that the example tree 550 described with respect to FIG. 5 has only been analyzed herein with respect to a portion of Branch 1A and its sub-branches, e.g., to the various branch pathways that are possible given a time horizon of 15 minutes. It should be appreciated that the controller may also similarly analyze all possible subsequent actions and branch pathways for Branches 1B-1F for the pre-determined time horizon. These subsequent actions have been omitted for purposes of brevity.

In general, multiple actions may be performed in parallel, e.g., simultaneously, so long as there are no scheduling conflicts. Thus, a particular branch pathway may lead to a node of the tree that includes simultaneous and/or parallel actions. For example, as explained above with respect to block 561 and FIG. 4, the first boat 112a may be lowered from the first reactor 106 at the same time that the second boat 112b is moved to the carousel 111. However, it should be appreciated that parallel actions may lead to the partial execution of an action. For example, in various embodiments, when one action is finished before the other action, a decision point is reached in the tree. For example, after 2 minutes in block 562, moving the second boat 112b to the carousel 111 has been fully completed while lowering the first boat 112a has only been partially completed, e.g., 1 minute remains until the first boat 112a is fully lowered to the carousel 111. Thus, at the end of moving the second boat 112b to the carousel 111, the position of the elevator 114a and the first boat 112a is in an undefined, intermediate position. In various embodiments, partial completion of an action will be accounted for in the method 300, such that the controller may account for even intermediate positions when analyzing branches of the search tree and/or the time needed to complete the partially completed action. For example, when analyzing potential subsequent actions, the controller or processor may store intermediate positions in memory and may incorporate the time needed to complete the partially-completed action when analyzing potential subsequent actions.

Typically, the completion of an action will not exactly coincide with the time horizon. An action might be completed earlier than the time horizon, which means that another action can be started, or an action may be partially completed at the time horizon. In order to allow a fair comparison between different branch pathways, all branch pathways may be truncated at the predetermined time horizon and the time required to complete a partially completed action is taken into account when scoring the branch pathways. Furthermore, as explained above, it may be desirable to reduce the size of the search tree in order to maintain a manageable set of actions to evaluate. The pre-determined time horizon or look-ahead time may advantageously reduce the size of the search tree. However, as explained herein, the size of the search tree may further be reduced by ignoring useless actions, such as rotating an empty carousel, rotating the carousel twice in a row without moving a boat, and picking up a boat from the carousel and replacing it without rotating the carousel or exchanging substrates in the boat. Moreover, in various embodiments, visited states may be remembered by the controller such that a previously-visited state is not executed again. If, for example, a new state was previously visited during another time period, then the controller may not explore returning to that state. As one example, if a boat is removed from the reactor and placed on the carousel in a new state, then the controller may not consider simply placing the boat back in the reactor without further intermediate processing or substrate exchange. In considering the state of the system at a particular time, the controller or processor may take into account the overall processing status of a set of substrates when determining the state, even where the controller or processor's internal clock indicates that the state properties are unequal. For example, at time t=0, a particular boat at the front carousel position with 10 minutes of cool-down time left is at the same state at time t=5 minutes as a boat in the same position with 5 minute of cool-down time left. However, the system as a whole is at a different state at t=5 minutes when the boat has a full 10 minutes of cool-down time left. Skilled artisans will appreciate that various other ways of generating and limiting the size of the search tree are possible.

Returning to FIG. 3, after generating the search tree in block 304, the method 300 may proceed to a block 306 to score each branch pathway of the generated search tree. In the block 304, multiple branches were generated for each action capable of being performed when the system is in the current state shown in the example embodiment of FIG. 4. As explained herein, each branch, e.g., Branches 1A-1F with each permutation of sub-branches off these branches, may include one or more branch pathways that can be scored based on any suitable factor or weight. In some embodiments, the entire branch pathway of the tree spanning from the current state to the last possible action within the pre-determined time horizon may be analyzed when scoring the branch pathway, e.g., Branch 1A of FIG. 5 may include a branch pathway spanning from block 553 to one of blocks 560, 561, and 562.

A scoring function can be applied to each generated branch pathway based on various suitable processing parameters. In various embodiments, desirable situations (e.g., actions that increase throughput and/or reduce processing times) may receive a positive score, while undesirable situations (e.g., actions that reduce throughput, such as actions that lead to bottlenecks) may receive a negative score. For example, without being limited by theory, the branch pathways of the tree 550 may be scored based on how far each boat has advanced in its processing sequence. Further, branch pathways that increase the idle time of the reactor(s) may be penalized (e.g., may receive a negative score), because reactor(s) that are not being used in a process may decrease the overall throughput of the system. Also, if performing actions along a certain branch would cause a boat to be stuck in a reactor when it may instead be moved to a subsequent processing step, the particular branch pathway may also be penalized in order to reduce bottlenecks in the system. For example, the scoring function may account for the amount of time that a boat waits in a reactor before being lowered. Actions that increase bottlenecks may receive negative scores, while actions that reduce bottlenecks and/or improve throughput may receive positive scores. Thus, each branch pathway may be scored based at least in part on the ability of each boat to proceed to a subsequent processing step.

To score the branch pathways, appropriate weights may be assigned to each action in each branch. As explained herein, actions that speed up or otherwise reduce bottlenecks may receive positive scores or weights, while actions that slow down or otherwise increase bottlenecks may receive negative scores or weights. In some embodiments, the overall score of a branch pathway may be determined based on a weighted sum of each action in the branch pathway, such that the overall processing time may be accounted for when weighing the benefits of executing the actions of a particular branch pathway of the tree. Actions that incur penalties, e.g., actions that increase the idle time of the reactor(s) or that cause bottlenecks, may receive a negative score or weight or a fractional weight in various embodiments. In addition, in various embodiments, certain weights may favor one particular boat over another, depending on the devices that are being manufactured in the boats and/or the priority of finishing one particular boat relative to another. For example, if the operator prioritizes the processing of Boat A over Boat B for reasons related to, e.g., the value of the boats, then Boat A may be assigned a higher or otherwise more favorable weight than Boat B. In general, however, in some embodiments, the branch pathways of the tree may be scored to increase the overall throughput of the system and/or to reduce the processing time for a particular boat. In some embodiments, the degree of occupancy of each reactor may be considered in addition to or separate from the weighting noted above. For example, high reactor occupancy can correspond to actions that result in a high number of reactors being used simultaneously, and low reactor occupancy can correspond to actions that result in only one or a few reactors being used simultaneously. Because high occupancy states can increase throughput, branch pathways that lead to high reactor occupancy may receive positive scores, while branch pathways that lead to low reactor occupancy may receive negative scores.

Turning to block 308 of the method 300, the controller may select a branch pathway to be performed by the system based at least in part on the score of the selected branch pathway. As explained herein, it may be desirable to select a branch pathway providing the highest throughput for the system, e.g., to increase the number of substrates that are processed in a given amount of time. In this situation the scoring function may be arranged such that the branch pathway having the highest throughput may be selected in various embodiments. In some aspects, the controller may select the branch pathway that provides the lowest cycle time of one or more boats through the system, and the scoring function may be arranged accordingly. In some embodiments, the selected branch pathway may be the branch pathway with the best score as determined by the block 306.

Therefore, as explained herein, a selected branch pathway may include several consecutive actions that begin with the current state and that end in the last action that can be performed before or when the time horizon is reached. In the example disclosed with respect to FIG. 5, for example, the controller may score every possible branch pathway within the time horizon and may select one of the scored branch pathways. For example, the controller may select the branch pathway beginning in the block 553 that proceeds to the block 559, and that terminates in the block 562. The scored and selected branch pathways may therefore include multiple, alternative pathways of consecutive actions that may be performed by the system in various states. It should also be appreciated that, even though a controller selects a particular branch pathway of consecutive actions, the controller may, after completion of an action, reconsider the selected branch pathway and repeat the method 300 of FIG. 3. If, for example, the system is performing the action in block 559 of the selected branch pathway (e.g., exchanging a wafer load in boat 112*b*), the system may recognize a system change, e.g., an unexpected delay in a parallel performed action, or an error from time to time, such as misaligned or absent substrates in the exchange station. The controller can recognize such delays or errors in real-time and can adapt accordingly by recognizing the current state (e.g., including the error), generating a search tree, and scoring and selecting the appropriate branch pathway. Thus, the systems and methods disclosed herein can advantageously adapt to changing conditions in real-time. In addition, in some embodiments, the criteria by which a branch pathway is scored may change with changes in circumstance (e.g., selection of a branch pathway after some error conditions may be based on different criteria than selection at the start of a progress sequence, when the system is assumed to be performing normally).

Once a branch pathway has been selected in block 308, the system may perform the actions in the selected branch pathway. The controller may communicate the actions of the selected branch pathway to the system, and the system may manipulate the boats as prescribed by the selected branch pathway. It should be appreciated that the method 300 may be performed repetitively such that the current state of the system may be determined repetitively by the controller. The controller may repetitively generate the search tree, score each branch pathway of the tree, select the branch pathway of actions to be performed, and cause the system to perform the one or more subsequent actions of the selected branch pathway. Thus, the controller may advantageously determine the desired, e.g., most efficient, action sequence based on the present and simulated subsequent states of the system in order to provide high throughput.

Batch Processing and Other Types of Systems

The scheduling processes disclosed above with respect to FIGS. 3-5 may be employed with any suitable processing system. For example, it should be appreciated that the method 300 of FIG. 3 may be scalable to any number or type of processing stations. Indeed, the controller 120 may generate a search tree for any suitable number of processing stations and may score and select a particular branch pathway based on the criteria explained herein. The disclosed embodiments may thereby advantageously enhance throughput for systems with any number and type of processing stations, including, e.g., the single DRM system 201 shown in FIG. 1A, the two DRM system 101 shown in FIG. 2A, or cluster tools where substrates may be processed in different processing stations, such as single substrate stations arrayed around a central transfer station.

Figure 6:
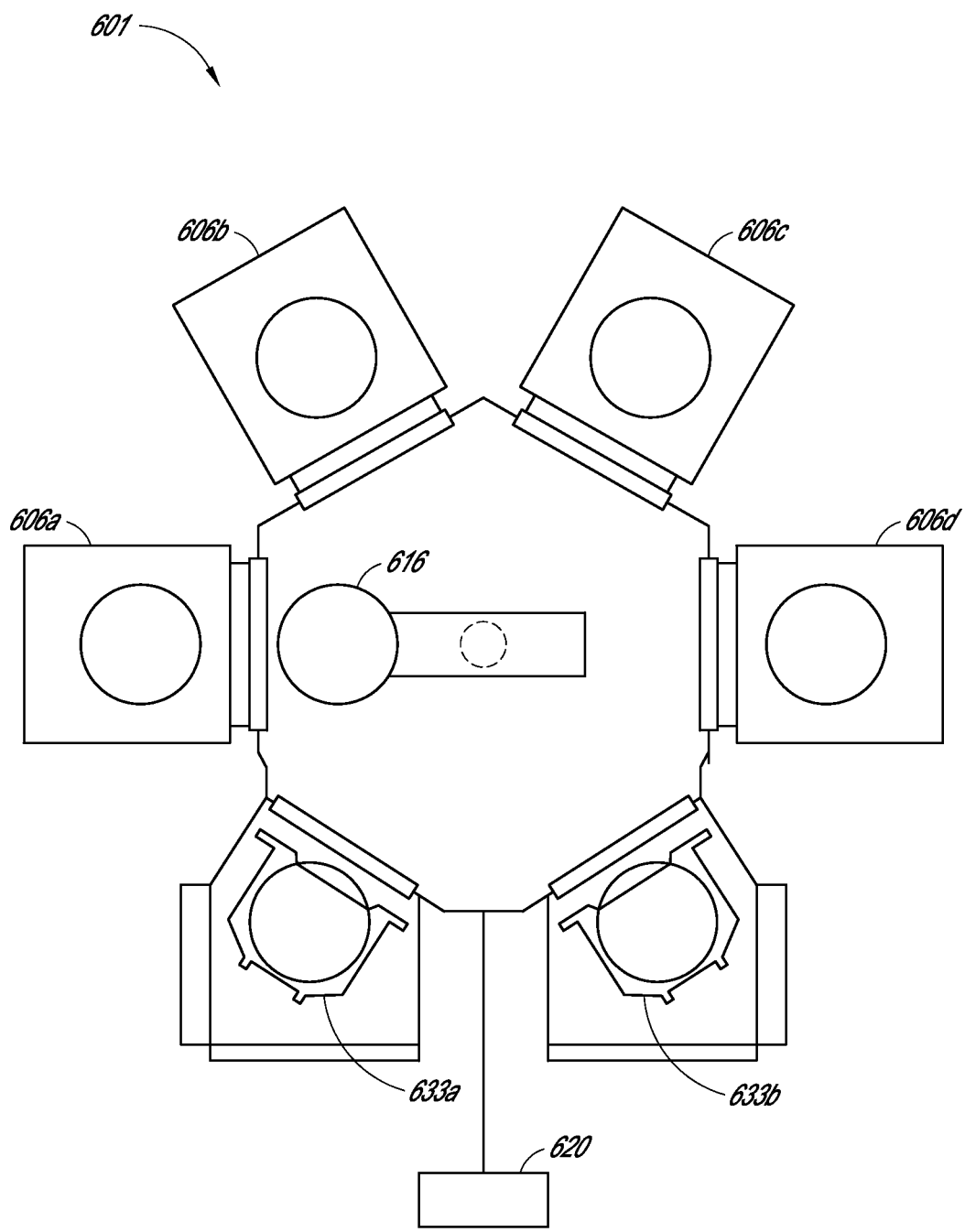
FIG. 6 is a top plan view of a cluster tool system, according to some embodiments.

FIG. 6 is a top plan view of a cluster tool processing system 601, according to some embodiments. The system 601 can include a first IO station 633*a* and a second IO station 633*b*. The first IO station 633*a* may be used to accommodate substrates (e.g., by housing a substrate holder) and provide unprocessed substrates into the system 601 or to receive processed substrates from the system 601, or the first IO station 633*a* may be configured to both provide and receive substrates into and from the system 601. Similarly, the second IO station 633b may be used to provide unprocessed substrates into the system 601 or to accept process substrates from the system 601, or the second IO station 633b may be configured to both provide and receive substrates into and from the system 601.

A manipulator 616 may be configured to move substrates from the IO stations 633a and/or 633b to one of multiple processing stations 606a, 606b, 606c, and 606d. The processing stations 606a, 606b, 606c, and 606d may be any suitable type of processing station. The processing stations 606a-606d may be the same type of processing station, or they may be configured to apply different types of processes to the substrates. For example, the processing stations 606a-606d may include one or more of a deposition chamber, an etching chamber, a lithographic station, a cooling station, or any other suitable type of processing station. In various embodiments, the processing stations 606a-606d may be configured to process a single substrate at a time. In other embodiments, more than one substrate may be processed in the processing stations.

The method 300 explained above with respect to FIGS. 3-5 may similarly be used with respect to the cluster processing system 601 illustrated in FIG. 6. For example, a controller 620 may be programmed to schedule the various processes to be performed in the processing stations 606a-606d in order to improve throughput. The controller 620 can be programmed to reduce bottlenecks and to ensure that the processing stations 606a-606d are operated at improved capacity or efficiency. As with the examples shown in FIGS. 4 and 5, the controller 620 can generate numerous branches and sub-branches, forming various branch pathways that represent potential actions that may be taken when the system 601 is in the current state, and the controller 620 can score the potential branch pathways that may be taken by the system for a pre-determined time horizon. Thus, the disclosed scheduling methods may be used in many types of processing systems.

Features and methods described herein may be embodied in, and automated by, computer programs, including software modules, which may be executed by processors or integrated circuits of general purpose computers. The software modules may be stored in any type of non-transitory computer storage device or medium, which may be in electronic communication with a processor or integrated circuit, which in turn may be part of the controller 120 (FIG. 2A). Thus, the controller may be programmed to perform any of the methods described herein.

Although the various inventive features and services have been described in terms of certain preferred embodiments, other embodiments that are apparent to those of ordinary skill in the art, including embodiments which do not provide all of the benefits and features set forth herein and do not address all of the problems set forth herein, are also within the scope of this invention. All combinations and sub-combinations of the various embodiments and features described herein fall within the scope of the present invention. The scope of the present invention is defined only by reference to the appended claims.

What is claimed is:

1. A semiconductor processing system, comprising:
   a controller configured to schedule the operation of the processing system, the controller programmed to:
   determine a current state of the system, the current state being defined at least by a location of one or more substrates and a processing status of the one or more substrates;
   generate a search tree having one or more branch pathways, each branch pathway identifying one or more sequences of subsequent actions that are capable of being performed by the system in the current state;
   score each branch pathway of the generated search tree; and
   select a branch pathway based at least in part on the score of the branch pathway.

2. The system of claim 1, wherein the controller is programmed to instruct the system to perform the one or more identified subsequent actions in the selected branch pathway of the search tree.

3. The system of claim 1, wherein each branch pathway and each action in a branch pathway has an associated duration, wherein additional branch pathways are generated or additional actions in each branch pathway are identified until the total duration elapsed by the generated branch pathways or identified actions in each branch pathway reaches a pre-determined time horizon.

4. The system of claim 3, wherein the pre-determined time horizon is in a range of about 10 minutes to about 45 minutes.

5. The system of claim 1, wherein the controller, for each identified subsequent action of the one or more identified subsequent actions, is further programmed to, for each of the identified subsequent actions:
   determine a subsequent state of the system if the identified subsequent action is performed, the subsequent state being defined at least by a location of one or more substrates and a processing status of the one or more substrates; and
   analyze the subsequent state to determine a set of one or more actions that are capable of being performed when the system is in the subsequent state.

6. The system of claim 1, wherein the controller is programmed to score each branch pathway based at least in part on the amount of time it takes to perform each action of the branch pathway.

7. The system of claim 1, wherein the controller is programmed to score each branch pathway based at least in part on an amount of time that a reactor of the system is idle.

8. The system of claim 7, wherein the controller is programmed to penalize branch pathways of the search tree that increase the idle time of the reactor.

9. The system of claim 1, wherein the controller is programmed to score each branch pathway based at least in part on a processing status of each of the one or more substrates.

10. The system of claim 9, wherein the controller is programmed to score each branch pathway based at least in part on the ability of each substrate to proceed to a subsequent processing step.

11. The system of claim 1, further comprising one or more boats, wherein the controller is programmed to score each branch pathway based at least in part on a processing status of each boat of the one or more boats.

12. The system of claim 11, wherein the controller is programmed to score each branch pathway based at least in part on the ability of each boat to proceed to a subsequent processing step.

13. The system of claim 12, wherein the controller is programmed to penalize branch pathways of the search tree that create processing bottlenecks.

14. The system of claim 13, wherein the controller is programmed to assign a negative or fractional weight to branch pathways that create processing bottlenecks.

15. The system of claim 1, wherein the controller is programmed to select the branch pathway having a shortest time for completing a largest number of steps in a process sequence for the one or more substrates.

16. The system of claim 1, wherein the controller is further programmed to repetitively determine the current state of the system, generate the search tree, score each branch pathway, and select a branch pathway of identified action(s) to be performed.

17. The system of claim 1, further comprising a reactor module, the reactor module comprising:
a first reactor; and
a transfer device configured to transfer a boat of the substrates at least between an exchange position and the first reactor.

18. The system of claim 17, the reactor module further comprising:
a second reactor; and
a rotatable carousel having at least two carousel positions configured to support the boat of the substrates, the carousel configured to transfer the boat of the substrates at least between the first reactor and the second reactor, wherein the current state of the system is further defined at least by an orientation of the carousel.

19. The system of claim 18, wherein the rotatable carousel is configured to position a first boat of substrates located in a first carousel position underneath the first reactor and a second boat of substrates located in a second carousel position underneath the second reactor.

20. The system of claim 18, wherein the transfer device is configured to:
exchange one or more substrate holders in a boat at the exchange position; and
transfer a boat of substrates at least between the exchange position and the carousel.

21. The system of claim 18, wherein the current state of the system is further defined by one or more of:
an amount of time until a boat is scheduled to enter the first reactor;
an amount of time in which a process is scheduled to continue in the first reactor; and
an amount of time until a boat is scheduled to leave the first reactor.

22. The system of claim 21, the reactor module further comprising:
a first boat elevator configured to move a boat of substrates from the carousel into the first reactor; and
a second boat elevator configured to move a boat of substrates from the carousel into the second reactor.

23. The system of claim 22, wherein the current state of the system is further defined by a position of the first boat elevator and a position of the second boat elevator.

24. The system of claim 18, wherein the one or more actions that are capable of being performed when the reactor module is in the current state includes at least one of:
rotating the carousel by 90°;
rotating the carousel by 180°;
removing a boat from the carousel using the transfer device;
placing a boat on the carousel using the transfer device;
exchanging substrates in a boat at the exchange position;
positioning a boat in the first reactor or the second reactor;
processing a boat;
removing a boat from the first reactor or the second reactor; and
cooling a boat.

25. The system of claim 1, further comprising a plurality of boats, each boat configured to support multiple substrates, wherein the current state of the system is further defined by the positions of the plurality of boats.

26. The system of claim 25, wherein the current state of the system is further defined by at least one of:
an amount of time that each boat is scheduled to cool down; and
a subsequent process step for each boat.

27. The system of claim 1, wherein the controller is further programmed to store previously-visited states and to exclude previously-visited states from the generated search tree.

28. The system of claim 1, wherein the controller is further programmed to exclude useless or non-productive actions from the generated search tree.

29. The system of claim 1, wherein the controller is further programmed to generate branch pathways of the search tree that include multiple actions to be performed simultaneously.

30. The system of claim 1, wherein the controller is further programmed to adapt to changing system conditions in real-time.

31. The system of claim 1, wherein the system is a cluster tool processing system, the system further comprising a plurality of substrate processing stations in communication with the controller.

32. The system of claim 31, wherein each processing station is configured to process a single substrate at a time.

33. The system of claim 31, wherein the processing stations are arrayed around a central transfer station.

34. The system of claim 31, wherein each processing station is configured to apply a different type of process to one or more substrates accommodated in the processing station.

35. The system of claim 31, wherein each processing station includes one or more of: a deposition chamber, an etching chamber, a lithographic station, and a cooling station.

36. The system of claim 31, further comprising a first IO station configured to provide unprocessed substrates into the processing stations or to receive processed substrates from the processing stations.

37. The system of claim 36, further comprising a manipulator configured to move substrates from the first IO station to or from the one or more processing stations.

38. A method for semiconductor processing, the method comprising:
determining a current state of a semiconductor processing system, the current state being defined at least by a location of one or more substrates and a processing status of the one or more substrates;
generating a search tree having one or more branch pathways, each branch pathway identifying one or more sequences of subsequent actions that are capable of being performed when the system is in the current state;
scoring each branch pathway of the generated search tree; and
selecting a branch of pathway based at least in part on the score of the branch pathway.

39. The method of claim 38, further comprising performing the one or more identified subsequent actions in the selected branch pathway of the search tree.

40. The method of claim 38, wherein each branch pathway and each action in a branch pathway has an associated duration, wherein additional branch pathways are generated or additional actions in each branch pathway are identified until the total duration elapsed by the generated branch pathways or actions in each branch pathway reaches a pre-determined time horizon.

41. The method of claim 38, for each identified subsequent action of the one or more identified subsequent actions, further comprising:

determining a subsequent state of the system if the identified subsequent action is performed, the subsequent state being defined at least by a location of one or more substrates and a processing status of the one or more substrates; and analyzing the subsequent state to determine a set of one or more actions that are capable of being performed when the system is in the subsequent state.

42. The method of claim 38, further comprising scoring each branch pathway based at least in part on an amount of time that a reactor of the system is idle.

43. The method of claim 38, further comprising scoring each branch pathway based at least in part on the processing status of each boat of one or more boats.

44. The method of claim 38, further comprising scoring each branch pathway based at least in part on the ability of each boat to proceed to a subsequent processing step.

45. A non-transitory computer-readable medium having stored thereon code that when executed performs the method of claim 38.

* * * * *